(12) United States Patent
Chen

(10) Patent No.: US 6,464,197 B1
(45) Date of Patent: Oct. 15, 2002

(54) ANTISLIP PAD FOR CHARGEOVER SWITCH

(75) Inventor: Kevin Chen, Shijr (TW)

(73) Assignee: Aten International Co., Ltd., Taipei (TW)

( * ) Notice: Subject to any disclaimer, the term of this patent is extended or adjusted under 35 U.S.C. 154(b) by 0 days.

(21) Appl. No.: 09/954,542

(22) Filed: Sep. 14, 2001

(51) Int. Cl.[7] .............................................. F16M 11/00
(52) U.S. Cl. ....................... 248/687; 248/682; 248/694; 248/615; 206/320; 206/586
(58) Field of Search ................................ 248/682, 687, 248/694, 615, 345.1; 206/586, 320

(56) References Cited

U.S. PATENT DOCUMENTS

| | | | | |
|---|---|---|---|---|
| 4,850,490 A | * | 7/1989 | Reynolds ..................... | 206/320 |
| 4,925,149 A | * | 5/1990 | DiFrancesca et al. ........ | 206/320 |
| 5,265,720 A | * | 11/1993 | Meliconi ..................... | 150/165 |
| 5,385,232 A | * | 1/1995 | Foos et al. .................. | 206/320 |
| 5,392,920 A | * | 2/1995 | Prete ........................... | 206/320 |
| 6,092,651 A | * | 7/2000 | Miller ......................... | 206/305 |
| 6,123,200 A | * | 9/2000 | Stephens et al. ............ | 206/320 |
| RE37,253 E | * | 7/2001 | Moren et al. ................ | 206/586 |
| 6,268,039 B1 | * | 7/2001 | Chou et al. .................. | 206/453 |

\* cited by examiner

*Primary Examiner*—Leslie A. Braun
*Assistant Examiner*—Deborah Brann
(74) *Attorney, Agent, or Firm*—W. Wayne Liauh

(57) ABSTRACT

An antislip pad is designed for protectively mounting onto an end of a changeover switch that is used to change over computer peripherals to be connected to a main unit of the computer. The pad is made of a material providing good softness. When a changeover switch has two antislip pads mounted onto two ends thereof, a bottom surface of the switch is not in direct contact with a surface on which the switch is positioned, protecting the switch from easily slipping over or dropping from the surface. The antislip pad is provided at upper and lower end surfaces with corresponding recesses and projections, respectively, so that two or more antislip pads could be stacked with the projections of an upper pad fitly engaging with the recesses of a lower pad to prevent the stacked pads from slipping relative to each other.

3 Claims, 6 Drawing Sheets

ANTISLIP PAD FOR CHARGEOVER SWITCH

BACKGROUND OF THE INVENTION

The present invention relates to an antislip pad for protectively mounting onto an end of a changeover switch, particularly a changeover switch for computer peripherals, so that the changeover switch having antislip pads mounted at two ends thereof does not easily slip over a supporting surface due to a minor external force applied on the switch.

With the highly developed electronic and information technologies, people could obtain required information and do transactions over networks via computers. Thus, the computer has become a necessary tool in people's daily life, work, study, recreation, and leisure activities.

There are many peripherals that could be connected to a computer to perform works on-line. However, only a limited number of connecting ports are provided on a computer main unit for the peripherals. To solve this problem, there is developed a changeover switch providing multiple connecting ports to enable connection of more peripherals to the main unit. By operating knobs or push buttons provided on the changeover switch, it is possible to decide which peripherals are on-line. For some users who use the computer at high frequency, it is a common thing to have two or more main units. In this case, the users may also use the above-mentioned changeover switch to switch among different main units.

The changeover switch usually includes a casing that is made of metal or rigid plastics and therefore has highly rigid and smooth surface. The changeover switch is usually flatly positioned on a top of the main unit that also has rigid and smooth surface. Due to the rigid and smooth contact surface between the changeover switch and the top of the main unit, the changeover switch tends to slip over and drop from the main unit. Moreover, in the case two or more changeover switches are used, they are usually sequentially stacked. The changeover switches being stacked at higher positions are frequently subject to slip and drop and resultant damages.

A slipped and fallen changeover switch would very possibly result in disconnected cable and/or unwanted operation of knobs or push buttons on the switch, and therefore causes abrupt stop of on-line operations on the computer or abnormal shutdown of the computer, as well as serious loss of important data that are being processed.

It is therefore necessary to work out some way to protect the changeover switch against undesired slipping and falling from a supporting surface.

SUMMARY OF THE INVENTION

A primary object of the present invention is to provide an antislip pad having good softness for mounting onto an end of a changeover switch to protect upper and lower surfaces of the switch. A changeover switch having two ends protected with the antislip pads of the present invention is not in direct contact with a smooth supporting surface and is therefore not easily subject to slip due to a minor external force applied on the changeover switch.

To achieve the above and other objects, the antislip pad for changeover switch according to the present invention is in the shape of a lying letter "n" having a vertical wall portion and two ribs inward projected from front and rear ends, respectively, of the vertical wall portion, so that the two ribs and an inner surface of the vertical wall portion together define a limiting space adapted to restrain front, rear, top and bottom edges and an end surface of an end of the changeover switch when the antislip pad is locked onto the end of the changeover switch with fastening members or screws.

Two upper and two lower lugs are vertically correspondingly provided at upper and lower end surfaces, respectively, of the antislip pad of the present invention. Each of the upper lugs is provided at a top with a round recess, and each of the lower lugs is provided at a bottom with a round projection having an outer diameter slightly smaller than an inner diameter of the round recess, so that two or more antislip pads could be stacked with the projections of an upper pad fitly engaging with the recesses of a lower pad to prevent the superposed pads from slipping relative to each other.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
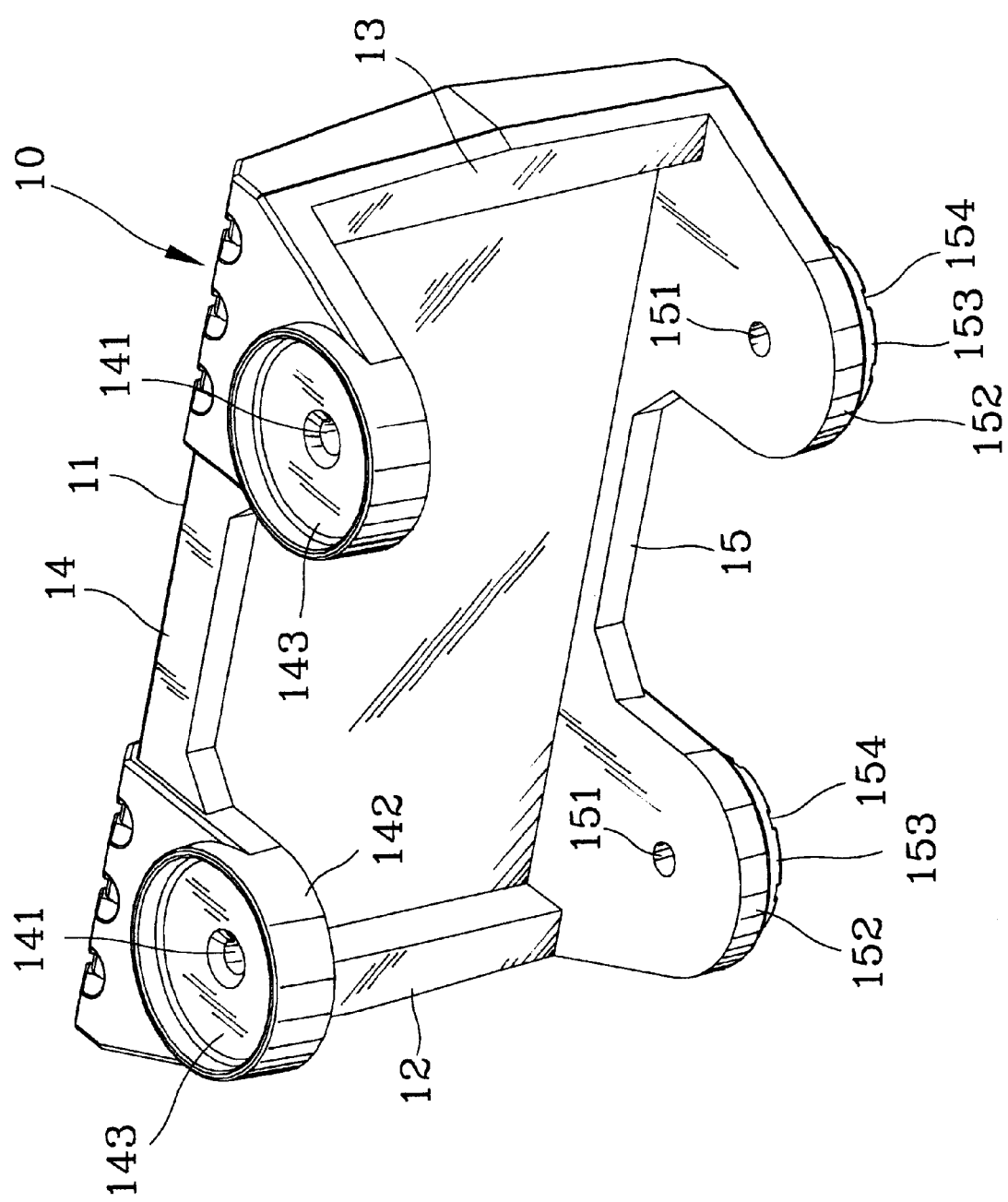
FIG. 1 is a perspective of an antislip pad for changeover switch according to the present invention viewed from an inner side thereof.
Figure 2:
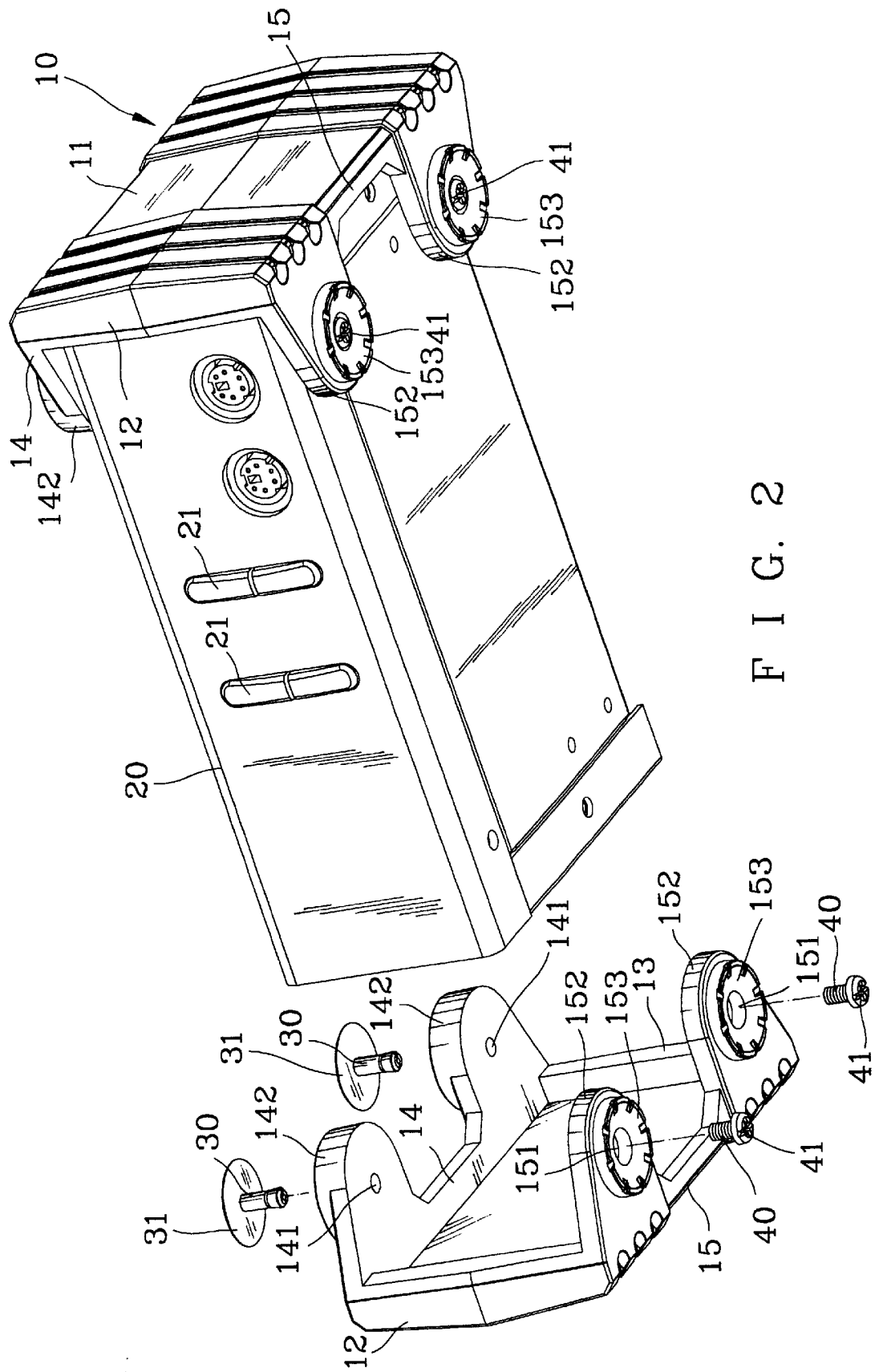
FIG. 2 shows the mounting of the antislip pad of the present invention onto a changeover switch.

Please refer to FIGS. 1 and 2. The present invention relates to an antislip pad 10 for mounting onto an end of a changeover switch 20 to protect the latter. The antislip pad 10 has good softness and is in the shape of a lying letter "n" having a sideward opening in which an end of the changeover switch 20 is located. The antislip pad 10 includes a vertical wall portion 11 and two ribs 12, 13 inward projected from front and rear ends, respectively, of the vertical wall portion 11, so that the ribs 12, 13 and an inner surface of the vertical wall portion 11 together define a limiting space adapted to restrain front, rear, top and bottom edges and an end surface of the end of the changeover switch 20 located in the sideward opening of the antislip pad 10. The antislip pad 10 also includes two spaced upper lugs 142 and two spaced lower lugs 152 inward and horizontally extended from upper and lower end surfaces 14, 15, respectively, of the vertical wall portion 11. The upper and the lower lugs 142, 152 are provided with through holes 141, 151 for fastening members 30 and screws 40, respectively, to extend thereinto and thereby locking the antislip pad 10 to the changeover switch 20 to protectively wrap one end of the changeover switch 20.

The antislip pad 10 may be molded from PVC material so as to possess good softness and provide good antislip ability without the risk of scratching a casing of the changeover switch 20 and a top of a main unit of a computer (not shown) with which the antislip pad 10 contacts.

Figure 3:
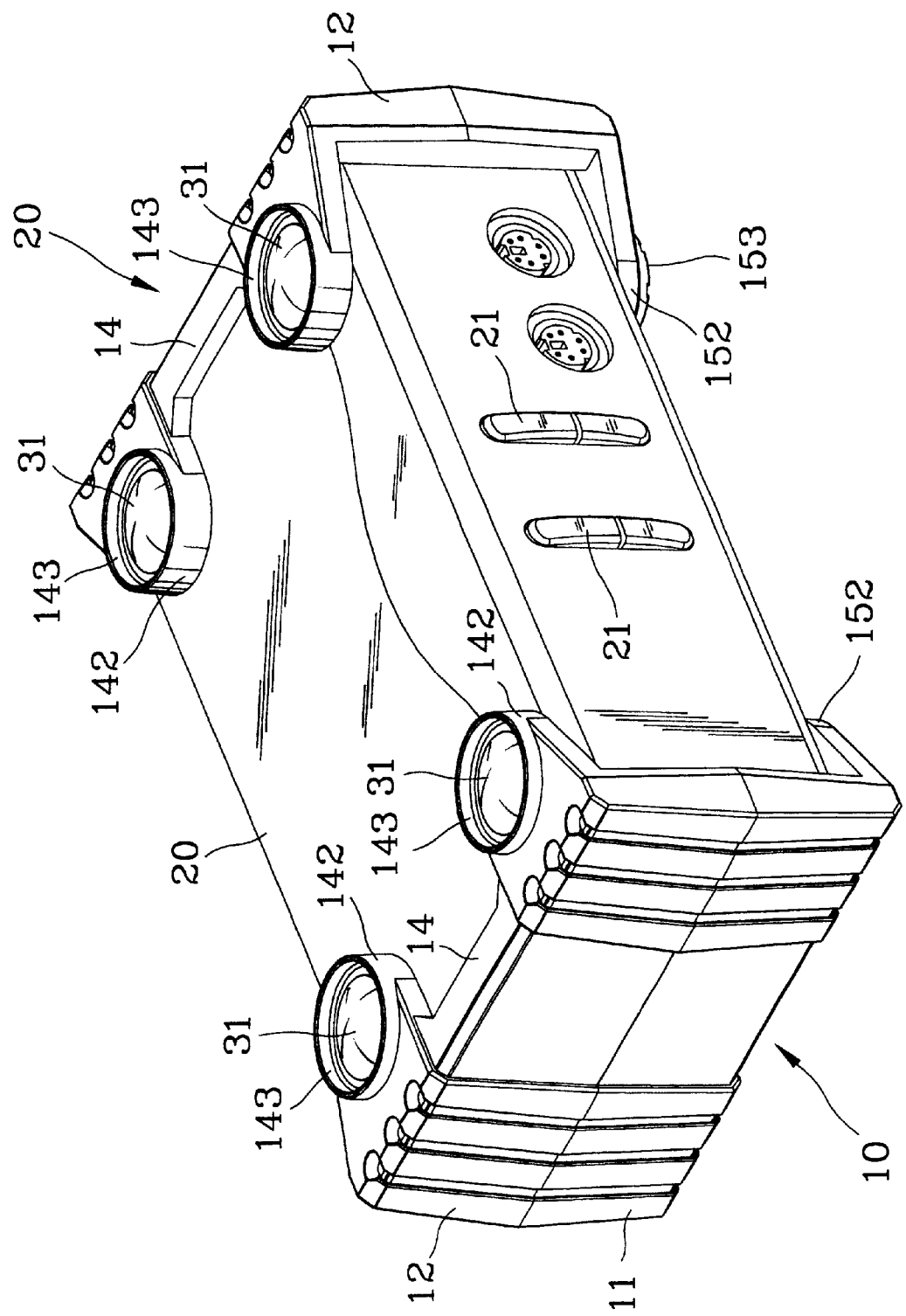
FIG. 3 shows a changeover switch having two antislip pads of the present invention mounted to two ends thereof.
Figure 4:
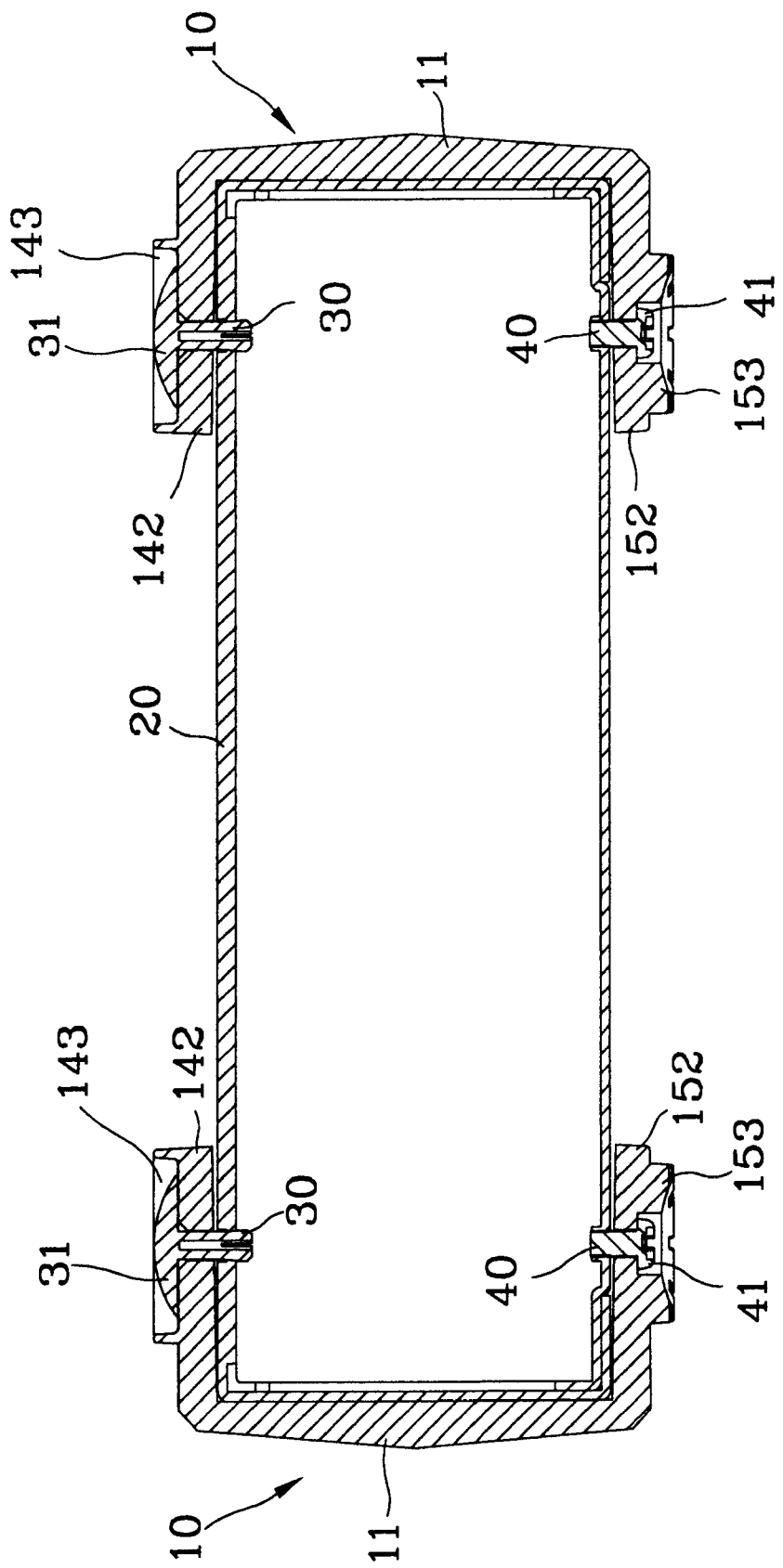
FIG. 4 is a partially sectioned side view of FIG. 3.

Please refer to FIG. 3. Two antislip pads 10 are separately mounted onto two ends of the changeover switch 20. When the changeover switch 20 is flatly positioned on the top of the main unit of the computer, the lower end surfaces 15 and the lower lugs 152 of the antislip pads 10 prevent the changeover switch 20 from directly contacting with the top of the main unit. With the good antislip ability of the pads 10, the changeover switch 20 is protected against slipping on the top of the main unit. In the event the changeover switch 20 is inadvertently dropped from the main unit, the antislip pads 10 may also protect the dropped changeover switch 20 from damage. The upper and the lower lugs 142, 152 are vertically symmetrically provided at the upper and the lower end surfaces 14, 15 of the antislip pad 10 and allow the pad 10 to be formed with reduced material. Each of the two upper lugs 142 is formed at a top with a round recess 143, and each of the lower lugs 152 is formed at a bottom with a round projection 153 corresponding to the round recess 143 (see FIG. 2). The projection 153 has an outer diameter slightly smaller than an inner diameter of the recess 143. The through holes 141 and 151 are provided at centers of the recesses 143 and the projections 153, respectively. Moreover, each of the through holes 151 has an expanded outer end. When the screw 40 is screwed into the central through hole 151 of the projection 153 to fasten the lower lug 152 of the antislip pad 10 to a bottom of the changeover switch 20, a head 41 of the screw 40 is seated in the expanded outer end of the through hole 151 without protruding from a bottom surface of the projection 153. The upper lug 142 is fastened onto a top of the changeover switch 20 by extending the fastening member 30 through the through hole 141 centered at the upper lug 142, as shown in FIG. 4. The fastening member 30 may be a T-shaped member having an expandable lower stem portion.

Figure 5:
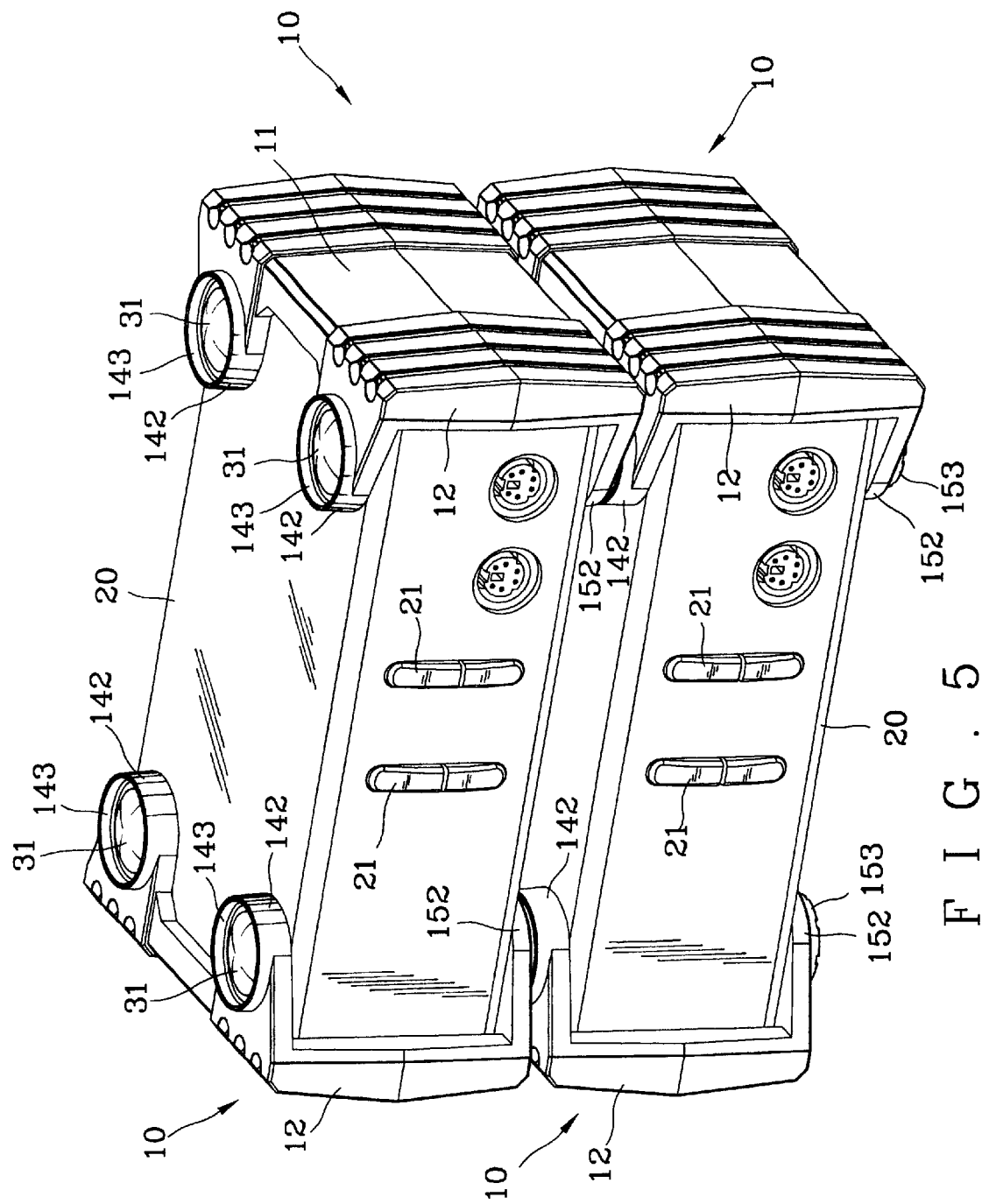
FIG. 5 shows two changeover switches with the antislip pads of the present invention are stacked.
Figure 6:
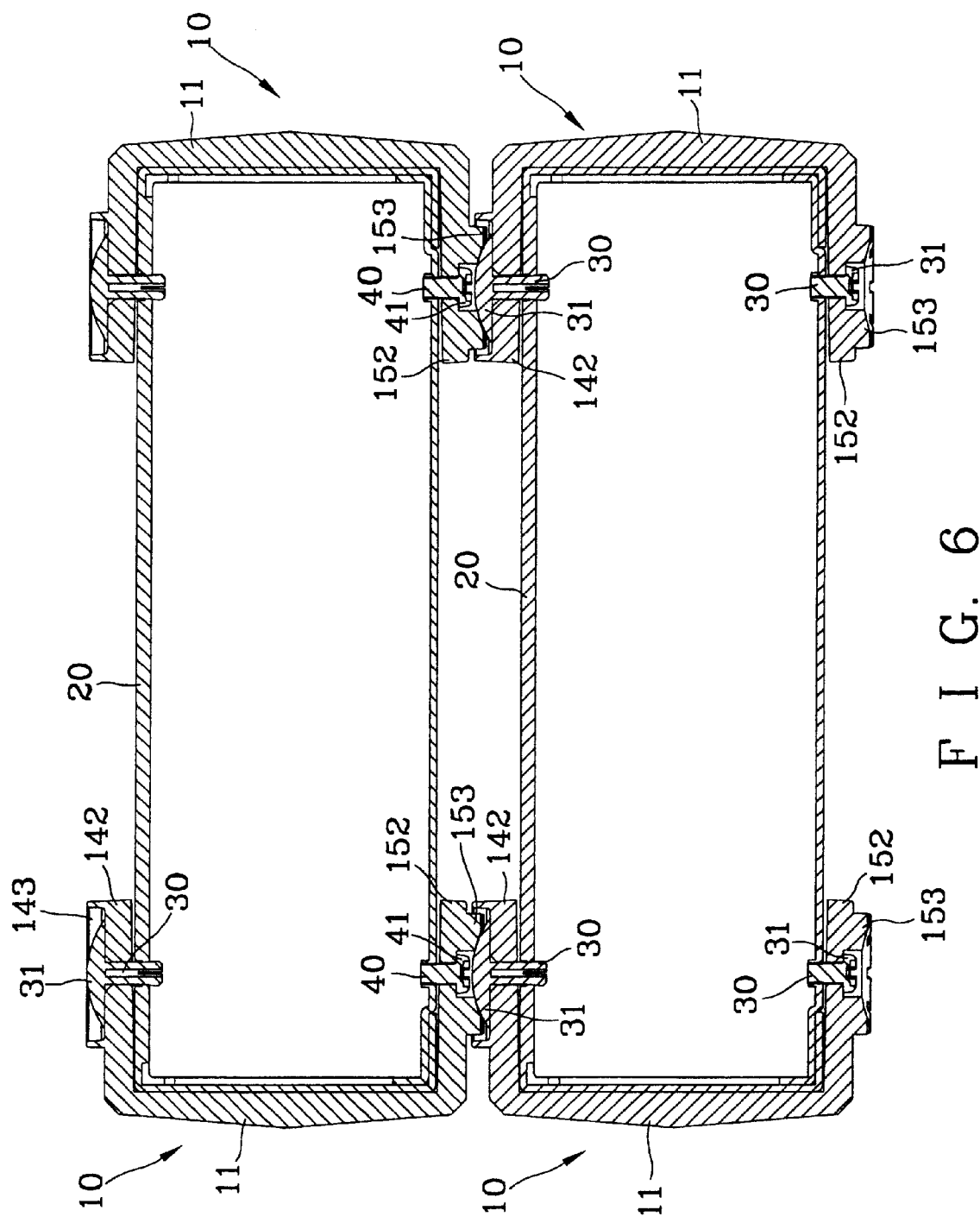
FIG. 6 is a partially sectioned side view of FIG. 5.

When there are two or more changeover switches 20 to be used, the changeover switches 20 are normally sequentially stacked, as shown in FIG. 5, so that a user may conveniently operate knobs or push buttons 21 provided on the switches 20. The antislip pads 10 attached to two ends of the stacked changeover switches 20 are also stacked. As having been mentioned above, the projection 153 has an outer diameter slightly smaller than the inner diameter of the recess 143. Therefore, the bottom projections 153 of the antislip pads 10 on an upper changeover switch 20 would fitly locate in the top recesses 143 of the antislip pads 10 on a lower changeover switch 20 to provide good positioning effect, as shown in FIG. 6, and prevent the upper changeover switch 20 from easily sliding and/or dropping due to a minor external force applied thereon.

The T-shaped fastening member 30 for locking the upper lug 142 of the antislip pad 10 to the changeover switch 20 has a slightly convex head 31. And, the round projection 153 has a slightly concave bottom surface corresponding to a curvature of the convex head 31 of the fastening member 30, such that the bottom projections 153 of upper antislip pads 10 would fitly contact with the heads 31 of the fastening members 30 in the top recesses 143 of lower antislip pads 10, as can be best seen in FIG. 6. Moreover, the bottom projections 153 are provided along their outer peripheries with a plurality of notches 154 (see FIG. 1), so that the projections 153 have contact surfaces with increased roughness to provide enhanced antislip ability.

The antislip pad for changeover switch according to the present invention has simple structure while it provides good antislip effect, and is therefore an ideal means for providing computer users a reliable working environment.

What is claimed is:

1. An antislip pad for changeover switch, comprising a pad in the shape of a lying letter "n" having a sideward opening in which an end of said changeover switch is located; said pad including a vertical wall portion and two ribs inward projected from front and rear ends, respectively, of said vertical wall portion, so that said two ribs and an inner surface of said vertical wall portion together define a limiting space adapted to restrain front, rear, top and bottom edges and an end surface of an end of said changeover switch located in said sideward opening of said antislip pad; and said pad being provided at upper and lower end surfaces with through holes for fastening members or screws to extend thereinto and thereby locking said antislip pad to said changeover switch to protectively wrap one end of said changeover switch.

2. The antislip pad as claimed in claim 1, wherein said upper and said lower end surfaces of said pad comprise two upper lugs and two lower lugs, respectively, and said upper and said lower lugs are vertically symmetrically provided on said pad.

3. The antislip pad as claimed in claim 2, wherein each of said upper lugs is provided at a top with a round recess, and each of said lower lugs is provided at a bottom with a round projection; and said round projection having an outer diameter slightly smaller than an inner diameter of said round recess.

* * * * *